(12) United States Patent
Schaetzle

(10) Patent No.: US 11,388,814 B2
(45) Date of Patent: Jul. 12, 2022

(54) ELECTRICALLY CONDUCTIVE FILM

(71) Applicant: GENTHERM GMBH, Odelzhausen (DE)

(72) Inventor: Martin Schaetzle, Odelzhausen (DE)

(73) Assignee: GENTHERM GMBH, Odelzhausen (DE)

( * ) Notice: Subject to any disclaimer, the term of this patent is extended or adjusted under 35 U.S.C. 154(b) by 133 days.

(21) Appl. No.: 16/483,627

(22) PCT Filed: Jan. 30, 2018

(86) PCT No.: PCT/DE2018/000014
§ 371 (c)(1),
(2) Date: Aug. 5, 2019

(87) PCT Pub. No.: WO2018/145682
PCT Pub. Date: Aug. 16, 2018

(65) Prior Publication Data
US 2020/0053873 A1    Feb. 13, 2020

(30) Foreign Application Priority Data

Feb. 7, 2017 (DE) .................... 10 2017 001 097.8
Apr. 25, 2017 (DE) .................... 10 2017 003 979.8

(51) Int. Cl.
*H05K 1/02* (2006.01)
*H05B 3/03* (2006.01)
(Continued)

(52) U.S. Cl.
CPC ........ *H05K 1/0277* (2013.01); *H01M 50/502* (2021.01); *H05B 1/0294* (2013.01);
(Continued)

(58) Field of Classification Search
CPC .. H05K 1/0277; H05K 1/0296; H05K 1/0212; H05K 3/043; H05K 2201/0129;
(Continued)

(56) References Cited

U.S. PATENT DOCUMENTS 5,824,996 A    10/1998    Kochman et al.
5,961,869 A    10/1999    Irgens
(Continued)

FOREIGN PATENT DOCUMENTS

DE    19939174 A1    4/2001
DE    19939174    * 12/2005
(Continued)

OTHER PUBLICATIONS

International Search Report from the European Patent Office for Application No. PCT/US2017/061931 dated Jul. 16, 2018.
(Continued)

*Primary Examiner* — Shawntina T Fuqua
(74) *Attorney, Agent, or Firm* — The Dobrusin Law Firm, P.C.

(57) ABSTRACT

The invention relates to an electrically conductive film (10) having an electrically nonconductive substrate layer (12), and an electrically conductive metal layer (14) that has a structure produced by material removal and that on a first side is joined, at least in sections, to the substrate layer (12).

19 Claims, 4 Drawing Sheets

(51) Int. Cl.
   *H05B 3/34* (2006.01)
   *H05K 3/04* (2006.01)
   *H01M 50/502* (2021.01)
   *H05B 1/02* (2006.01)

(52) U.S. Cl.
   CPC ............... *H05B 3/03* (2013.01); *H05B 3/34* (2013.01); *H05K 1/0296* (2013.01); *H05K 3/043* (2013.01); *H01M 2220/20* (2013.01); *H05B 2203/003* (2013.01); *H05B 2203/013* (2013.01); *H05B 2203/017* (2013.01); *H05K 2201/0129* (2013.01); *H05K 2201/0133* (2013.01); *H05K 2201/0145* (2013.01); *H05K 2201/09263* (2013.01); *H05K 2201/09727* (2013.01)

(58) Field of Classification Search
   CPC ... H05K 2201/0133; H05K 2201/0145; H05K 2201/09263; H05K 2201/09727; H05B 1/0294; H05B 3/03; H05B 3/34; H05B 3/84; H05B 2203/003; H05B 2203/013; H05B 2203/017; H01M 50/502; H01M 50/20; H01M 2220/20; H01M 10/615; H01M 10/6571; Y02E 60/10; F25D 1/00; F25C 3/04; F25C 3/00
   See application file for complete search history.

(56) References Cited

U.S. PATENT DOCUMENTS

| | | | |
|---|---|---|---|
| 6,031,214 A | 2/2000 | Bost et al. | |
| 6,054,690 A | 4/2000 | Petit et al. | |
| 6,057,530 A | 5/2000 | Gurevich | |
| 6,064,037 A | 5/2000 | Weiss et al. | |
| 6,070,115 A | 5/2000 | Oestreicher et al. | |
| 6,084,217 A | 7/2000 | Bulgajewski | |
| 6,093,910 A | 7/2000 | McClintock et al. | |
| 6,097,009 A | 8/2000 | Cole | |
| 6,111,234 A | 8/2000 | Batliwalla et al. | |
| 6,124,577 A | 9/2000 | Fristedt | |
| 6,143,206 A | 11/2000 | Handa et al. | |
| 6,147,332 A | 11/2000 | Holmberg et al. | |
| 6,150,642 A | 11/2000 | Weiss et al. | |
| 6,164,719 A | 12/2000 | Rauh | |
| 6,172,344 B1 | 1/2001 | Gordon et al. | |
| 6,189,487 B1 | 2/2001 | Owen et al. | |
| 6,194,692 B1 | 2/2001 | Oberle | |
| 6,215,111 B1 | 4/2001 | Rock et al. | |
| 6,220,659 B1 | 4/2001 | McDowell et al. | |
| 6,229,123 B1 | 5/2001 | Kochman et al. | |
| 6,278,090 B1 | 8/2001 | Fristedt et al. | |
| 6,294,758 B1 | 9/2001 | Masao et al. | |
| 6,307,188 B1 | 10/2001 | Bulgajewski | |
| 6,369,369 B2 | 4/2002 | Kochman et al. | |
| 6,415,501 B1 | 7/2002 | Schlesselman | |
| 6,423,951 B1 | 7/2002 | Elsasser | |
| 6,426,485 B1 | 7/2002 | Bulgajewski et al. | |
| 6,439,658 B1 | 8/2002 | Ganz et al. | |
| 6,452,138 B1 | 9/2002 | Kochman et al. | |
| 6,455,823 B1 | 9/2002 | Bulgajewski et al. | |
| 6,483,087 B2 | 11/2002 | Gardner et al. | |
| 6,495,809 B2 | 12/2002 | Bulgajewski et al. | |
| 6,501,055 B2 | 12/2002 | Rock et al. | |
| 6,512,203 B2 | 1/2003 | Jones et al. | |
| 6,559,422 B2 | 5/2003 | Burt | |
| 6,619,736 B2 | 9/2003 | Stowe et al. | |
| 6,629,724 B2 | 10/2003 | Ekern et al. | |
| 6,664,512 B2 | 12/2003 | Horey et al. | |
| 6,664,518 B2 | 12/2003 | Fristedt et al. | |
| 6,676,207 B2 | 1/2004 | Rauh et al. | |
| 6,686,562 B1 * | 2/2004 | Weiss .................. | H05B 3/34 219/217 |
| 6,710,303 B1 | 3/2004 | Lorenzen | |
| 6,713,733 B2 | 3/2004 | Kochman et al. | |
| 6,838,647 B2 | 1/2005 | Nagele | |
| 6,840,576 B2 | 1/2005 | Ekern et al. | |
| 6,857,697 B2 | 2/2005 | Brennan et al. | |
| 6,869,139 B2 | 3/2005 | Brennan et al. | |
| 6,869,140 B2 | 3/2005 | White et al. | |
| 6,872,882 B2 | 3/2005 | Fritz | |
| 6,884,965 B2 | 4/2005 | Nelson et al. | |
| 6,892,807 B2 | 5/2005 | Fristedt et al. | |
| 6,893,086 B2 | 5/2005 | Bajic et al. | |
| 6,906,293 B2 | 6/2005 | Schmiz et al. | |
| 6,976,734 B2 | 12/2005 | Stoewe | |
| 7,019,260 B1 | 3/2006 | Degand et al. | |
| 7,020,420 B2 | 3/2006 | Berg et al. | |
| 7,036,283 B2 | 5/2006 | Halas | |
| 7,040,710 B2 | 5/2006 | White et al. | |
| 7,052,091 B2 | 5/2006 | Bajic et al. | |
| 7,053,344 B1 | 5/2006 | Surgan et al. | |
| 7,083,227 B2 | 8/2006 | Brennan et al. | |
| 7,100,978 B2 | 9/2006 | Ekern et al. | |
| 7,131,689 B2 | 11/2006 | Brennan et al. | |
| 7,147,279 B2 | 12/2006 | Bevan et al. | |
| 7,168,758 B2 | 1/2007 | Bevan et al. | |
| 7,202,444 B2 | 4/2007 | Bulgajewski | |
| 7,205,510 B2 | 4/2007 | Howick | |
| 7,213,876 B2 | 5/2007 | Stoewe | |
| 7,223,948 B2 | 5/2007 | Howick et al. | |
| 7,285,748 B2 | 10/2007 | Nelson et al. | |
| 7,301,441 B2 | 11/2007 | Inada et al. | |
| 7,306,283 B2 | 12/2007 | Howick et al. | |
| 7,338,117 B2 | 3/2008 | Iqbal et al. | |
| 7,356,912 B2 | 4/2008 | Iqbal et al. | |
| 7,370,911 B2 | 5/2008 | Bajic et al. | |
| 7,475,938 B2 | 1/2009 | Stoewe et al. | |
| 7,478,869 B2 | 1/2009 | Lazanja et al. | |
| 7,500,536 B2 | 3/2009 | Bulgajewski et al. | |
| 7,506,938 B2 | 3/2009 | Brennan et al. | |
| 7,510,239 B2 | 3/2009 | Stowe | |
| 7,560,670 B2 | 7/2009 | Lorenzen et al. | |
| 7,569,795 B2 | 8/2009 | Ferguson | |
| 7,587,901 B2 | 9/2009 | Petrovski | |
| 7,618,089 B2 | 11/2009 | Stoewe et al. | |
| 7,637,569 B2 | 12/2009 | Krobok et al. | |
| 7,741,582 B2 | 6/2010 | Howick et al. | |
| 7,838,804 B2 | 11/2010 | Krobok | |
| 2002/0117495 A1 | 8/2002 | Kochman et al. | |
| 2003/0111454 A1 | 6/2003 | Ishiyama et al. | |
| 2003/0155347 A1 | 8/2003 | Oh et al. | |
| 2004/0021346 A1 | 2/2004 | Morinet et al. | |
| 2004/0065656 A1 | 4/2004 | Inagawa et al. | |
| 2004/0100131 A1 | 5/2004 | Howick et al. | |
| 2004/0211772 A1 | 10/2004 | Park | |
| 2005/0115956 A1 | 6/2005 | Wong | |
| 2005/0242081 A1 | 11/2005 | Howick | |
| 2006/0015801 A1 | 1/2006 | Suh et al. | |
| 2006/0138810 A1 | 6/2006 | Knoll et al. | |
| 2006/0158011 A1 | 7/2006 | Marlovits et al. | |
| 2007/0176471 A1 | 8/2007 | Knoll | |
| 2007/0278210 A1 | 12/2007 | Weiss | |
| 2008/0011732 A1 | 1/2008 | Ito et al. | |
| 2009/0218855 A1 | 9/2009 | Wolas | |
| 2009/0242548 A1 | 10/2009 | Iida et al. | |
| 2010/0035356 A1 | 2/2010 | Shalyt et al. | |
| 2010/0038356 A1 | 2/2010 | Fukuda et al. | |
| 2010/0038357 A1 | 2/2010 | Fukuda et al. | |
| 2010/0200558 A1 | 8/2010 | Liu et al. | |
| 2010/0219664 A1 | 9/2010 | Howick et al. | |
| 2010/0282458 A1 | 11/2010 | Ann et al. | |
| 2010/0326976 A1 | 12/2010 | Nakajima et al. | |
| 2011/0049131 A1 | 3/2011 | Sturgess | |
| 2011/0226751 A1 | 9/2011 | Lazanja et al. | |
| 2011/0290775 A1 | 12/2011 | Cubon et al. | |
| 2012/0049586 A1 | 3/2012 | Yoshimoto et al. | |

(56) References Cited

U.S. PATENT DOCUMENTS

2012/0228903 A1    9/2012   Abe et al.
2016/0021705 A1    1/2016   Barfuss

FOREIGN PATENT DOCUMENTS

| | | |
|---|---|---|
| DE | 102004025033 A1 | 12/2005 |
| DE | 202014103821 U1 | 9/2014 |
| DE | 112013005121 * | 8/2015 |
| DE | 112013005121 T5 | 8/2015 |
| EP | 0052079 A1 | 5/1982 |
| EP | 2400814 A2 | 12/2011 |
| JP | 02-120039 A | 5/1990 |
| WO | 86/02228 * | 4/1986 |
| WO | 86/02228 A1 | 4/1986 |
| WO | 99/38367 A1 | 7/1999 |
| WO | 2001/043507 A1 | 6/2001 |
| WO | 2005/027599 A1 | 3/2005 |
| WO | 2006/110730 A2 | 10/2006 |

OTHER PUBLICATIONS

International Search Report for Application No. PCT/DE2018/000014 dated May 9, 2018.
International Preliminary Report on Patentability, PCT/DE2018/00014, dated May 14, 2019.

\* cited by examiner

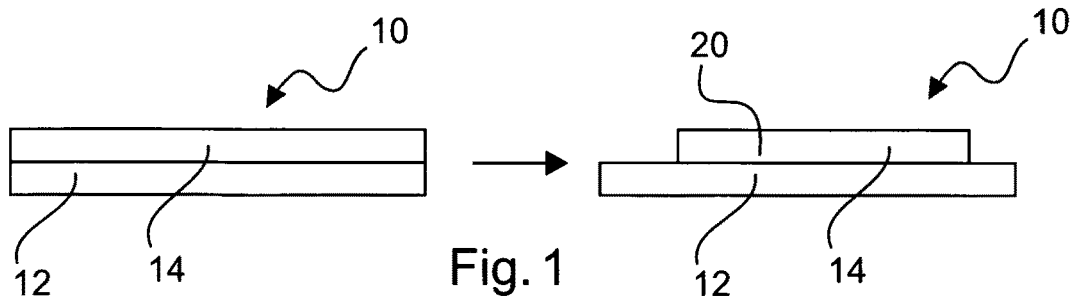
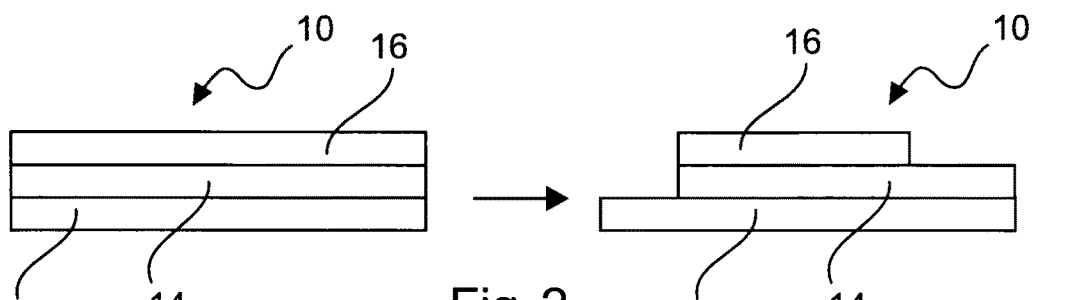
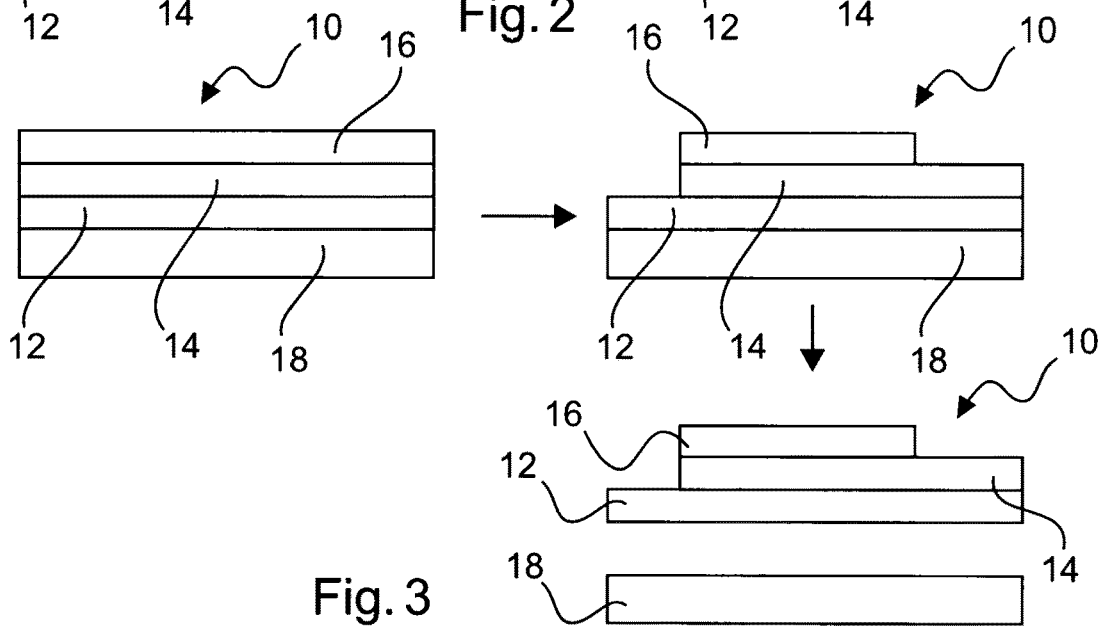
Fig. 3
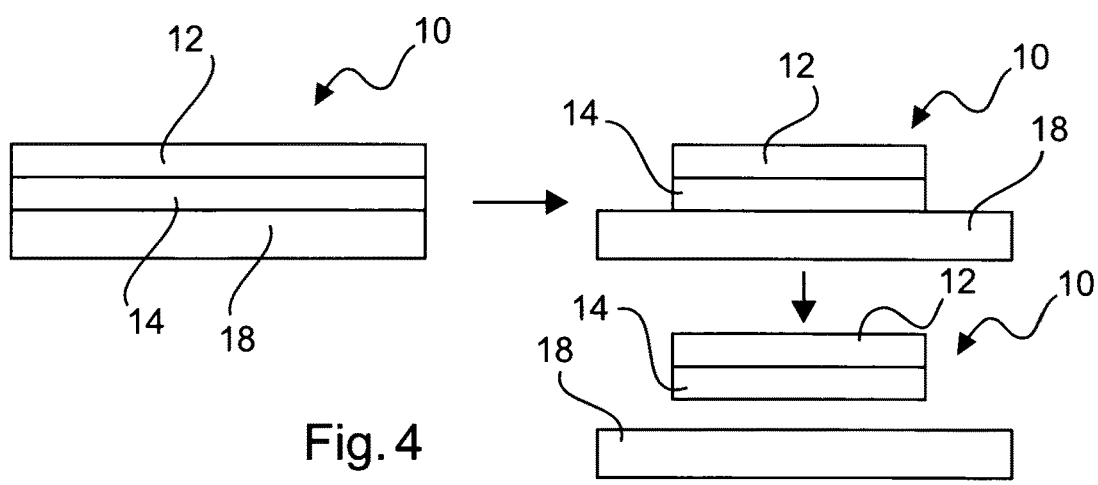
Fig. 4

ELECTRICALLY CONDUCTIVE FILM

The invention relates to an electrically conductive film having an electrically nonconductive substrate layer, and an electrically conductive metal layer that has a structure produced by material removal and that on a first side is joined, at least in sections, to the substrate layer.

The invention further relates to an electrical heating device having one or more electrically conductive films, a cell voltage tap, and a cell contacting unit for a battery, in particular a vehicle battery, having one or more electrically conductive films.

The invention further relates to a manufacturing method for an electrically conductive film, having the steps: providing a film that has at least one electrically nonconductive substrate layer and one electrically conductive metal layer, and producing a structure of the metal layer by means of a material-removing process, in particular a machining process.

As a result of the increasing electrification of current vehicles, there is a growing demand for electrically conductive structures that may be integrated into various vehicle components in a space-saving and/or unobtrusive manner.

For example, there is a great need for flat, elastic heating devices that may be integrated, for example, into a vehicle seat, a steering wheel, or other contact surfaces inside a vehicle.

In addition to such comfort-oriented application areas, flat electrically conductive structures are also needed for the drive train of electric vehicles and hybrid vehicles, for example to carry out space-saving contacting of unit cells of a vehicle battery or to allow measurement of their individual voltages.

Electrically conductive films on the one hand take up little installation space, and on the other hand have sufficient deformability, so that they are suitable for use in the comfort sector and in the area of electrical drives of vehicles.

However, the known electrically conductive films and other electrically conductive objects, such as flat ribbon cables, are not very suitable for a number of applications. In particular, the known electrically conductive films have insufficient mechanical strength and/or deformability. Flat ribbon cables lack an electrically conductive structural pattern, so that they are not usable in many application areas. In addition, the manufacture is often complicated and costly.

Furthermore, manufacturing methods are routinely used in the prior art in which harmful or even toxic substances are produced. These disadvantages are associated in particular with the etching of electrically conductive structures.

The object underlying the invention, therefore, is to provide an electrically conductive structure that is universally usable and that still at least partially overcomes the stated disadvantages.

The object is achieved by an electrically conductive film of the type stated at the outset, wherein the structure of the metal layer has one or more strip conductors that have at least one bent section.

The invention makes use of the finding that a multilayer film may be arbitrarily structured by material removal, for example by a material-removing process, so that electrically conductive films may be manufactured for different fields of application. Complex electrically conductive structural patterns may be produced as the result of one or more strip conductors having at least one bent section. Thus, the electrically conductive film is essentially universally usable as ribbon cable, for example. Within the meaning of the invention, a bent section of a strip conductor is understood to mean a strip conductor section that has a change in direction within the metal layer. Such a change in direction may be present, for example, when the strip conductor has a corner section that joins two linear strip conductor sections together. It is particularly advantageous when the electrically conductive film is used within a cell contacting unit for a battery. As a result of the structure of the metal layer having been produced by machining, in addition the need for using harmful substances for etching the structuring is eliminated.

In one preferred refinement of the electrically conductive film, the structure of the metal layer has one or more strip conductors, wherein at least one strip conductor includes multiple strip conductor sections whose strip conductor widths differ from one another. In particular, the individual strip conductor sections of the at least one strip conductor have strip conductor widths in the range between 5 millimeters and 1 millimeter. Preferred strip conductor widths are 4.2 millimeters, 3.8 millimeters, 3.2 millimeters, and 2.3 millimeters, for example.

In another embodiment of the electrically conductive film according to the invention, the multiple strip conductor sections of the at least one strip conductor extend in an offset manner and/or in parallel to one another. For an offset and parallel course of multiple strip conductor sections having different strip conductor widths, a transition section of the strip conductor results in each case between the strip conductor sections. This transition section may have the strip conductor width of one of the strip conductor sections that the transition section joins together. Alternatively, the transition section may have some other strip conductor width.

Also preferred is an electrically conductive film for which the strip conductor width of successive strip conductor sections of the at least one strip conductor increases or decreases along the course of the strip conductor. In this way, strip conductors may be implemented which have an overall resistance of less than 1 ohm over their length. Extremely thin strip conductors having a low overall resistance may thus be implemented. In addition, due to the different strip conductor widths of one or more strip conductors, the strip conductor design may be adapted to the available free surface area of the electrically nonconductive substrate layer. The overall width of all strip conductors may increase and/or decrease.

One particularly preferred embodiment of the electrically conductive film according to the invention has an electrically nonconductive cover layer having a structure that is produced by material removal, wherein the metal layer on a second side is joined, at least in sections, to the cover layer. The substrate layer preferably has an elastically deformable design, and thus allows the implementation of a deformable film that has a complex electrically conductive structure. The cover layer is preferably used as mechanical overload protection, which due to the elastic deformability prevents the electrically conductive structure of the metal layer from being damaged or destroyed.

In another embodiment of the electrically conductive film according to the invention, the substrate layer has a layer thickness in a range of 0.024 millimeter to 0.2 millimeter, the metal layer has a layer thickness in a range of 0.009 millimeter to 0.030 millimeter, and/or the cover layer has a layer thickness in a range of 0.024 millimeter to 0.2 millimeter.

The electrically conductive film according to the invention is further advantageously refined in that the structure of the cover layer that is produced by material removal is the same, in its entirety or in sections, as the structure of the metal layer that is produced by material removal. In the area or areas in which the structure of the cover layer and the structure of the metal layer are the same, the metal layer and the cover layer have the same contour. It is particularly advantageous when the electrically conductive film is used for an electrical heating device. In addition, the structure of the cover layer that is produced by material removal may be different, in its entirety or in sections, from the structure of the metal layer that is produced by material removal.

In another embodiment of the electrically conductive film according to the invention, the material of which the substrate layer is made has a lower modulus of elasticity than the material of which the cover layer is made. As the result of the material of which the substrate layer is made having a lower modulus of elasticity than the material of which the cover layer is made, when there is a tensile stress on the electrically conductive film, the majority of the forces are absorbed by the cover layer, and excessive stretching or elongation of the electrically conductive film is avoided. The risk of damage and failure of the electrically conductive film under tensile stress is reduced significantly by the prevention of excessive stretching or elongation of the electrically conductive film.

Also preferred is an electrically conductive film according to the invention in which the difference between the modulus of elasticity of the material of which the substrate layer is made and the modulus of elasticity of the material of which the cover layer is made is at least 20 megapascals. In a large number of application areas, a difference of 20 megapascals is adequate on the one hand to be able to ensure sufficient elastic deformability of the electrically conductive film, and on the other hand to achieve suitable protection from excessive tensile stress on the electrically conductive film.

In one advantageous embodiment of the electrically conductive film according to the invention, the substrate layer is made of a thermoplastic elastomer, in particular a thermoplastic polyurethane. Thermoplastic elastomers may be welded, and thus allow a connection to be established that is resistant and, if necessary for the particular purpose, watertight. Alternatively, the substrate layer may be made of a thermoplastic copolyamide, a thermoplastic polyester elastomer, a thermoplastic copolyester, a thermoplastic olefin-based elastomer, a styrene block copolymer, a thermoplastic vulcanized material, or a crosslinked thermoplastic olefin-based elastomer.

In one refinement of the electrically conductive film according to the invention, the material of which the substrate layer is made has a modulus of elasticity in the range of 10 to 100 megapascals. A modulus of elasticity in the range of 10 to 100 megapascals allows sufficient elastic deformation in order to use the electrically conductive film, for example, as an electrical heating device for bent or curved contact surfaces in the vehicle interior. However, the electrically conductive film may also be used as an electrical heating device for electrical components of the drive train having a bent or curved basic shape.

In addition, an electrically conductive film according to the invention is advantageous in which the substrate layer and/or the cover layer are/is made of a thermoplastic plastic, in particular polyethylene naphthalate or polyethylene terephthalate. Polyethylene naphthalate has high thermostability, so that the electrically conductive film may also be used at elevated temperatures and/or as an integral part of an electrical heating device. Polyethylene terephthalate has a high rupture strength and good wear characteristics. Thus, when polyethylene terephthalate is used, the risk of damage is reduced, and an electrically conductive film with a comparatively long service life is provided.

Also preferred is an electrically conductive film according to the invention in which the material of which the substrate layer and/or the cover layer are/is made has a modulus of elasticity in the range of 120 to 1200 megapascals. A modulus of elasticity in the range of 120 to 1200 megapascals ensures sufficient rigidity in order to provide an electrically conductive film that is resistant to mechanical tensile stress. In addition, when the material of which the cover layer is made has a modulus of elasticity in the range of 120 to 1200 megapascals, extremely precise material removal from the cover layer may take place during the manufacture, so that complex structural patterns with small tolerances in the cover layer may be produced.

In one advantageous embodiment of the electrically conductive film according to the invention, the electrically conductive metal layer is made of copper, a copper alloy, aluminum, copper-clad aluminum (CCA), and/or an aluminum alloy. Copper and aluminum have a high electrical conductivity, and are therefore particularly suited for use as a metal layer of the electrically conductive film. In addition, copper and aluminum allow a precise material-removing, in particular machining, process, so that complex structural patterns and/or finely structured strip conductors with small tolerances in the metal layer may be produced. In one particularly preferred embodiment, the electrically conductive metal layer is made of copper-clad aluminum. Copper-clad aluminum is less expensive than pure copper, since aluminum is less costly than copper. In addition, despite the required larger cross-sectional area, conductors made of copper-clad aluminum are more lightweight than solid copper conductors, with the same electrical conductivity.

In one embodiment, the electrically conductive film according to the invention has an electrically nonconductive supporting layer that is joined to the metal layer or to the side of the substrate layer opposite from the metal layer. If the electrically conductive film has no cover layer, the electrically conductive film may thus have a three-layer design. If the electrically conductive film has a cover layer, the electrically conductive film may thus have a four-layer design. During the manufacturing process, the supporting layer is temporarily joined to the electrically conductive film in order to ensure sufficient rigidity of the conductive film during the material removal, in particular machining. The connection between the substrate layer or the metal layer and the supporting layer preferably has a mechanically or chemically detachable design. In particular, the adhesive action between the substrate layer or the metal layer and the supporting layer is less than the adhesive action between the other layers of the electrically conductive film.

In another embodiment of the electrically conductive film according to the invention, the supporting layer has a layer thickness in a range of 0.024 millimeter to 0.2 millimeter.

Also preferred is an electrically conductive film according to the invention in which the supporting layer is made of a thermoplastic elastomer, in particular a thermoplastic polyurethane. Thermoplastic elastomers may be welded, and thus allow a resistant connection to be established. Alternatively, the substrate layer may be made of a thermoplastic copolyamide, a thermoplastic polyester elastomer, a thermoplastic copolyester, a thermoplastic olefin-based elastomer, a styrene block copolymer, a thermoplastic vulcanized material, or a crosslinked thermoplastic olefin-based elastomer.

In one advantageous refinement of the electrically conductive film, the adhesion of the supporting layer to the substrate layer or to the metal layer allows damage-free detachment of the supporting layer from the substrate layer or the metal layer. The adhesive action between the supporting layer and the substrate layer or the metal layer may be overcome by mechanical action, for example. Alternatively or additionally, chemical processes may bring about or at least facilitate the detachment of the supporting layer from the substrate layer or the metal layer.

The object underlying the invention is further achieved by an electrical heating device of the type mentioned at the outset, wherein the one or more electrically conductive films have a design according to one of the above-described embodiments. With regard to the advantages and modifications of the electrical heating device according to the invention, reference is made to the advantages and modifications of the electrically conductive film according to the invention.

In one particularly preferred embodiment of the electrical heating device, at least one strip conductor of the metal layer of an electrically conductive film is designed as a heating conductor and/or extends in a meandering manner in sections. A high heating effect may be achieved due to the meandering design of a heating conductor. Due to the fact that the metal layer may have a complex pattern structure, the electrically conductive film allows implementation of such a meandering structure. Alternatively, multiple strip conductors of the metal layer of the electrically conductive film may each be designed as a heating conductor and/or may extend in a meandering manner in sections and/or may be rounded in sections. The one or more heating conductors extending in a meandering manner may have a plurality of linearly running heating conductor sections, wherein multiple or all of the linearly running heating conductor sections may be oriented essentially in parallel to one another. Alternatively or additionally, the one or more heating conductors extending in a meandering manner, in their entirely or in sections, may have a bent, in particular nonuniformly bent, design, wherein the proportion of bent heating conductor sections preferably exceeds the proportion of linearly running heating conductor sections. The proportion of bent heating conductor sections is preferably greater than 75%, particularly preferably greater than 90%.

The object underlying the invention is further achieved by a cell contacting unit and a cell voltage tap of the type mentioned at the outset, wherein the one or more electrically conductive films have a design according to one of the above-described embodiments. With regard to the advantages and modifications of the cell contacting unit according to the invention, reference is made to the advantages and modifications of the electrically conductive film according to the invention.

In one advantageous embodiment of the cell contacting unit according to the invention, at least one electrically conductive film has contacting sections that are configured to be electroconductively connected to contact poles of unit cells. The electrically conductive film is thus preferably an integral part of a cell voltage tap system. When an electrically conductive film is used as an integral part of a cell voltage tap system or a cell contacting unit, it is particularly preferred that the electrically conductive film has a protective film on the side facing the unit cells, wherein the presence of such a protective film is not absolutely necessary.

The electrically conductive film may also be used in flat film antennas.

The object underlying the invention is further achieved by a manufacturing method of the type mentioned at the outset, wherein during production of the structure of the metal layer, one or more strip conductors are produced that have at least one bent section. With regard to the advantages and modifications of the manufacturing method according to the invention, reference is made to the advantages and modifications of the electrically conductive film according to the invention. An electrically conductive film according to one of the above-described embodiments is preferably manufactured by means of the manufacturing method.

In one embodiment of the manufacturing method according to the invention, the provided film has an electrically nonconductive cover layer, and the manufacturing method includes the production of a structure of the cover layer by means of a material-removing process, in particular a machining process. The production of the structure of the cover layer by means of a material-removing process, in particular a machining process, may also include the production of material elevations in the cover layer by means of an embossing roller and/or the removal of the material elevations by means of a milling wheel.

Also preferred is a manufacturing method according to the invention in which the production of the structure of the metal layer and the production of the structure of the cover layer take place at the same time, and/or the produced structure of the cover layer is the same, in its entirety or in sections, as the produced structure of the metal layer. An embossing roller preferably produces enough projecting material elevations in the metal layer and the cover layer that the material elevations in the metal layer and the cover layer, produced by the embossing roller, are at the same time removed by the milling wheel. By use of an embossing roller that has embossing sections with different heights, the manufacturing method according to the invention may also produce electrically conductive films whose various layers have different structural patterns.

Preferred embodiments of the invention are explained and described in greater detail below with reference to the appended drawings, which show the following:

FIG. 1 shows the manufacture of an electrically conductive film according to the invention in a schematic illustration;

FIG. 2 shows the manufacture of an electrically conductive film according to the invention in a schematic illustration;

FIG. 3 shows the manufacture of an electrically conductive film according to the invention in a schematic illustration;

FIG. 4 shows the manufacture of an electrically conductive film according to the invention in a schematic illustration;

Figure 5:
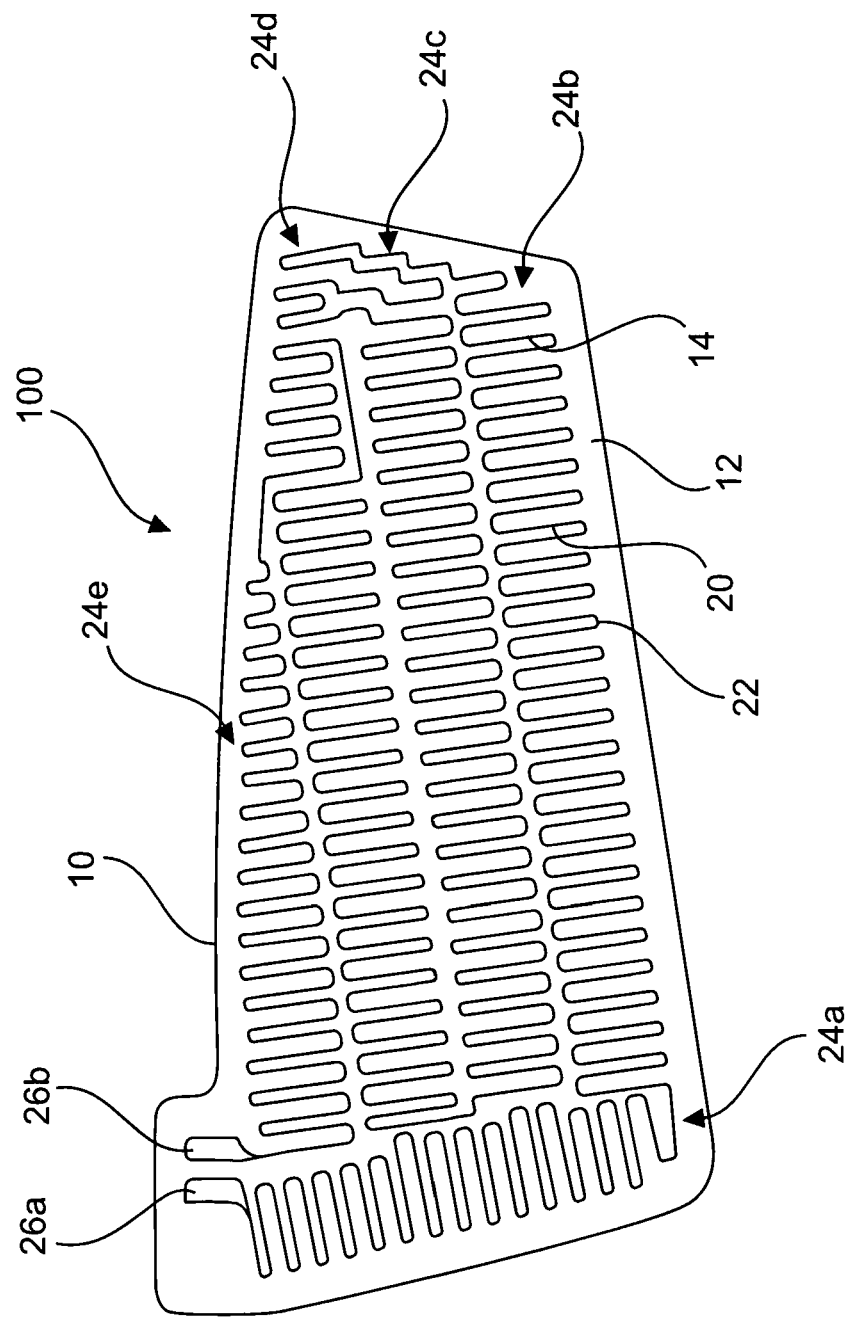
FIG. 5 shows one exemplary embodiment of the electrical heating device according to the invention in a schematic illustration.

FIG. 1 on the left side shows an electrically conductive film 10 having an electrically nonconductive substrate layer 12 and an electrically conductive metal layer 14.

The substrate layer 12 is made of a material that has a modulus of elasticity in the range of 120 to 1200 megapascals. For example, the substrate layer 12 may be made of polyethylene naphthalate or polyethylene terephthalate.

The metal layer 14 is made of copper and aluminum, for example copper-clad aluminum, and on a first side is joined to the substrate layer 12.

The right side of FIG. 1 shows the film 10 illustrated on the left side of FIG. 1, after material removal from the metal layer 14 has taken place. The produced structure of the metal layer 14 has a strip conductor 20 having a bent section (concealed).

FIG. 2 on the left side shows an electrically conductive film 10 having an electrically nonconductive substrate layer 12, an electrically conductive metal layer 14, and an electrically nonconductive cover layer 16.

The substrate layer 12 is made of a material that has a modulus of elasticity in the range of 120 to 1200 megapascals. For example, the substrate layer 12 may be made of polyethylene naphthalate or polyethylene terephthalate.

The metal layer 14 is made of copper and aluminum, for example copper-clad aluminum, and on a first side is joined to the substrate layer 12 and on a second side is joined to the cover layer 16.

The cover layer 16 is made of a material that has a modulus of elasticity in the range of 120 to 1200 megapascals. For example, the cover layer 16 may be made of polyethylene naphthalate or polyethylene terephthalate.

The right side of FIG. 2 shows the film 10 illustrated on the left side of FIG. 2, after material removal from the metal layer 14 and the cover layer 16 has taken place. The produced structure of the metal layer 14 is different from the produced structure of the cover layer 16.

FIG. 3 on the left side shows an electrically conductive film 10 having an electrically nonconductive substrate layer 12, an electrically conductive metal layer 14, an electrically nonconductive cover layer 16, and an electrically nonconductive supporting layer 18.

The substrate layer 12 is made of a material that has a modulus of elasticity in the range of 10 to 100 megapascals. For example, the substrate layer 12 may be made of a thermoplastic elastomer such as a thermoplastic polyurethane.

The metal layer 14 is made of copper and aluminum, for example copper-clad aluminum, and on a first side is joined to the substrate layer 12 and on a second side is joined to the cover layer 16.

The cover layer 16 is made of a material that has a modulus of elasticity in the range of 120 to 1200 megapascals. For example, the cover layer 16 may be made of polyethylene naphthalate or polyethylene terephthalate. The material of which the substrate layer 12 is made thus has a lower modulus of elasticity than the material of which the cover layer 16 is made. In addition, the difference between the modulus of elasticity of the material of which the substrate layer 12 is made and the modulus of elasticity of the material of the material of which the cover layer 16 is made is greater than 20 megapascals.

The supporting layer 18 is made of a material that has a modulus of elasticity in the range of 120 to 1200 megapascals. For example, the supporting layer 18 may be made of polyethylene naphthalate or polyethylene terephthalate, wherein the material thickness of the supporting layer 18 is greater than the respective material thicknesses of the other layers 12, 14, 16. In addition, the supporting layer 18 is joined to the side of the substrate layer 12 opposite from the metal layer 14, wherein the adhesion of the supporting layer 18 to the substrate layer 12 allows damage-free detachment of the supporting layer 18 from the substrate layer 12.

The right side of FIG. 3 shows the film 10 illustrated on the left side of FIG. 3, after material removal from the metal layer 14 and the cover layer 16 on the one hand, and detachment of the supporting layer 18 from the substrate layer 12 on the other hand, have taken place. The produced structure of the metal layer 14 differs from the produced structure of the cover layer 16. However, it is also conceivable for the material removal to take place in such a way that the produced structure of the cover layer 16 is the same, in its entirety or in sections, as the produced structure of the metal layer 14.

FIG. 4 on the left side shows an electrically conductive film 10 having an electrically nonconductive substrate layer 12, an electrically conductive metal layer 14, and an electrically nonconductive supporting layer 18.

The substrate layer 12 is made of a material that has a modulus of elasticity in the range of 120 to 1200 megapascals. For example, the substrate layer 12 may be made of polyethylene naphthalate or polyethylene terephthalate.

The metal layer 14 is made of copper and aluminum, for example copper-clad aluminum, and on a first side is joined to the substrate layer 12.

The supporting layer 18 is made of a material that has a modulus of elasticity in the range of 120 to 1200 megapascals. For example, the supporting layer 18 may be made of polyethylene naphthalate or polyethylene terephthalate, wherein the material thickness of the supporting layer 18 is greater than the respective material thicknesses of the other layers 12, 14. In addition, the supporting layer 18 is joined to the metal layer 14, wherein the adhesion of the supporting layer 18 to the metal layer 14 allows damage-free detachment of the supporting layer 18 from the metal layer 14.

The right side of FIG. 4 shows the film 10 illustrated on the left side of FIG. 4, after material removal from the metal layer 14 and the substrate layer 12 on the one hand, and detachment of the supporting layer 18 from the metal layer 14 on the other hand, have taken place. The produced structure of the metal layer 14 and the produced structure of the substrate layer 12 are the same.

FIG. 5 shows an electrical heating device 100 having an electrically conductive film 10. The electrically conductive film 10 has an electrically nonconductive substrate layer 12 and an electrically conductive metal layer 14.

The metal layer 14 includes a structure that is produced by material removal, and on a first side is joined to the substrate layer 12. The structure of the metal layer 14 has a strip conductor 20 that is designed as a heating conductor and that in the sections 24a-24e extends in a meandering manner and thus includes a plurality of bent sections 22. A contact section 26a, 26b is situated in each case at the ends of the heating conductor, wherein the heating conductor of the heating device 100 is suppliable with electrical energy via the contacting sections 26a, 26b.

Figure 6:
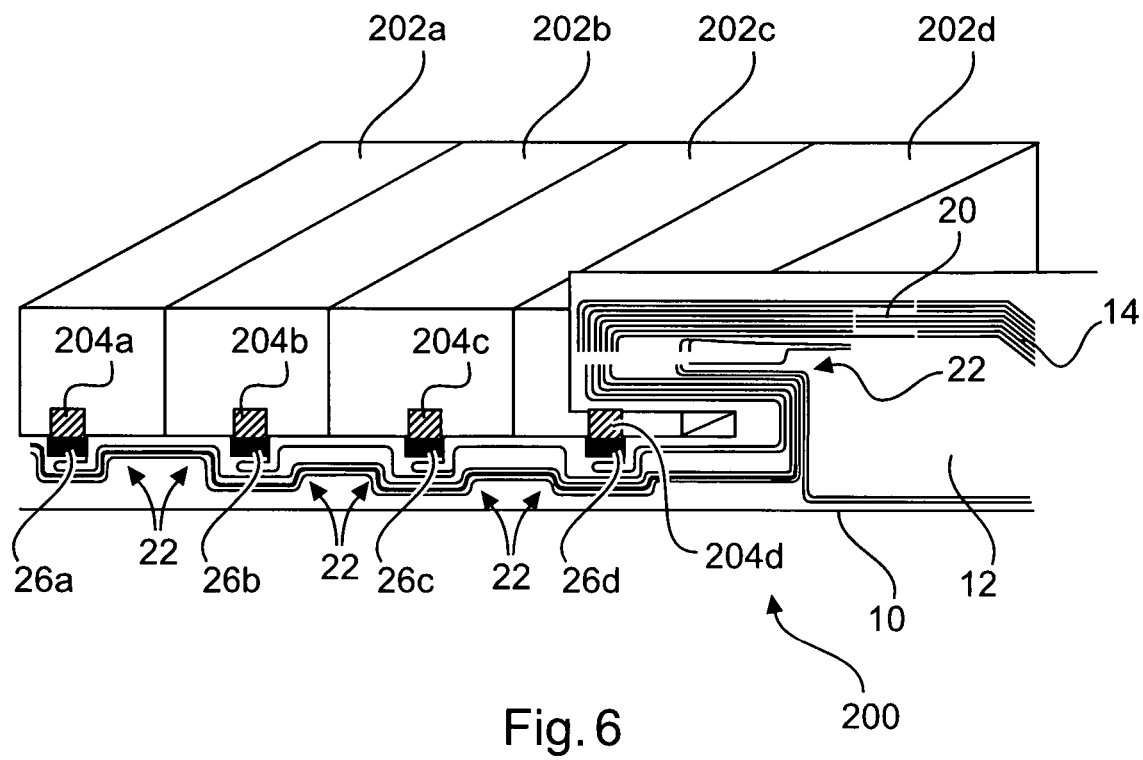
FIG. 6 shows one exemplary embodiment of the cell contacting unit according to the invention in a schematic illustration.

FIG. 6 shows a cell contacting unit 200 for a battery, namely, a vehicle battery. The cell contacting unit 200 has an electrically conductive film 10 that includes an electrically nonconductive substrate layer 12 and an electrically conductive metal layer 14.

The metal layer 14 has a structure that is produced by material removal, wherein the structure of the metal layer 14 includes multiple strip conductors 20 that have a plurality of bent sections 22.

The electrically conductive film 10 also includes contacting sections 26a-26d that are electroconductively connected to contact poles 204a-204d of unit cells 202a-202d.

Figure 7:
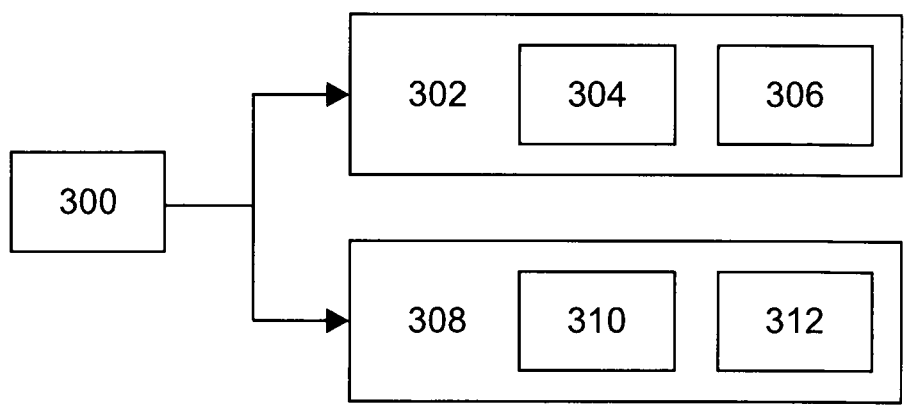
FIG. 7 shows one exemplary embodiment of the manufacturing method according to the invention in a block diagram.

FIG. 7 shows a manufacturing method for an electrically conductive film 10. The manufacturing method is initiated by the following step:

300) providing a film 10 having an electrically nonconductive substrate layer 12, an electrically conductive metal layer 14, and an electrically nonconductive cover layer 16.

After the film 10 has been provided, the following steps may be carried out:

302) producing a structure of the metal layer 14 by means of a machining process; and
308) producing a structure of the cover layer 16 by means of a machining process.

During production of the structure of the metal layer 14, multiple strip conductors 20 are created, wherein the production of the structure of the metal layer 14 by means of a machining process comprises the following two steps:

304) producing material elevations in the metal layer 14 by means of an embossing roller; and
306) removing the material elevations in the metal layer 14 by means of a milling wheel.

The product ion of the structure of the cover layer 16 by means of a machining process analogously comprises the following two steps:

310) producing material elevations in the cover layer 16 by means of the embossing roller; and
312) removing the material elevations in the cover layer 16 by means of the milling wheel.

The production of the structure of the metal layer 14 and the production of the structure of the cover layer 16 take place at the same time, namely, by the embossing roller producing sufficiently projecting material elevations in the metal layer 14 and the cover layer 16 so that the material elevations in the metal layer 14 and the cover layer 16 produced by the embossing roller may at the same time be removed by the milling wheel. The produced structure of the cover layer 16 is thus the same as the produced structure of the metal layer 14. Alternatively, however, by using an embossing roller that has embossing sections with different heights, it is also possible to produce electrically conductive films 10 whose various layers have different structural patterns.

Figure 8:
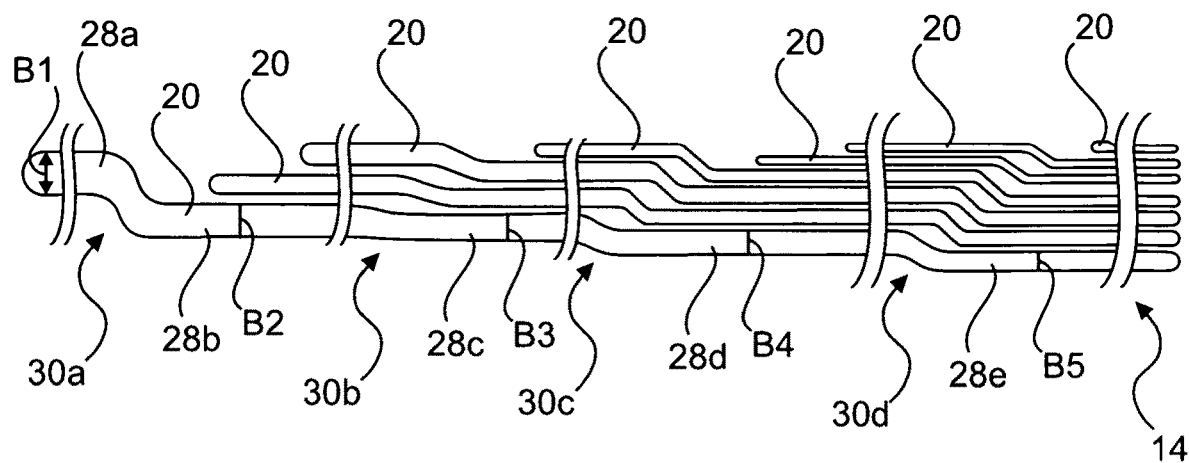
FIG. 8 shows the width profile of multiple strip conductors of a metal layer of an electrically conductive film according to the invention.

FIG. 8 shows the structure of multiple strip conductors 20 of a metal layer 14. All strip conductors 20 in each case have multiple strip conductor sections 28a-28e having strip conductor widths B1-B5 that are different from one another. The strip conductor sections 28a-28e of the strip conductors 20 extend in an offset manner and in parallel to one another. The strip conductor width B1-B5 of successive strip conductor sections 28a-28e increases along the course of the strip conductor. The strip conductor section 28a has a strip conductor width B1 of 4.2 millimeters. The strip conductor section 28b has a strip conductor width B2 of 3.8 millimeters. The strip conductor section 28c has a strip conductor width B3 of 3.2 millimeters. The strip conductor section 28d has a strip conductor width B4 of 2.3 millimeters. The strip conductor section 28e likewise has a strip conductor width B5 of 2.3 millimeters. Bent transition sections 30a-30d are situated between the strip conductor sections 28a-28e. The ends of the individual strip conductors 20 are positioned on one side, laterally offset relative to one another.

Figure 9:
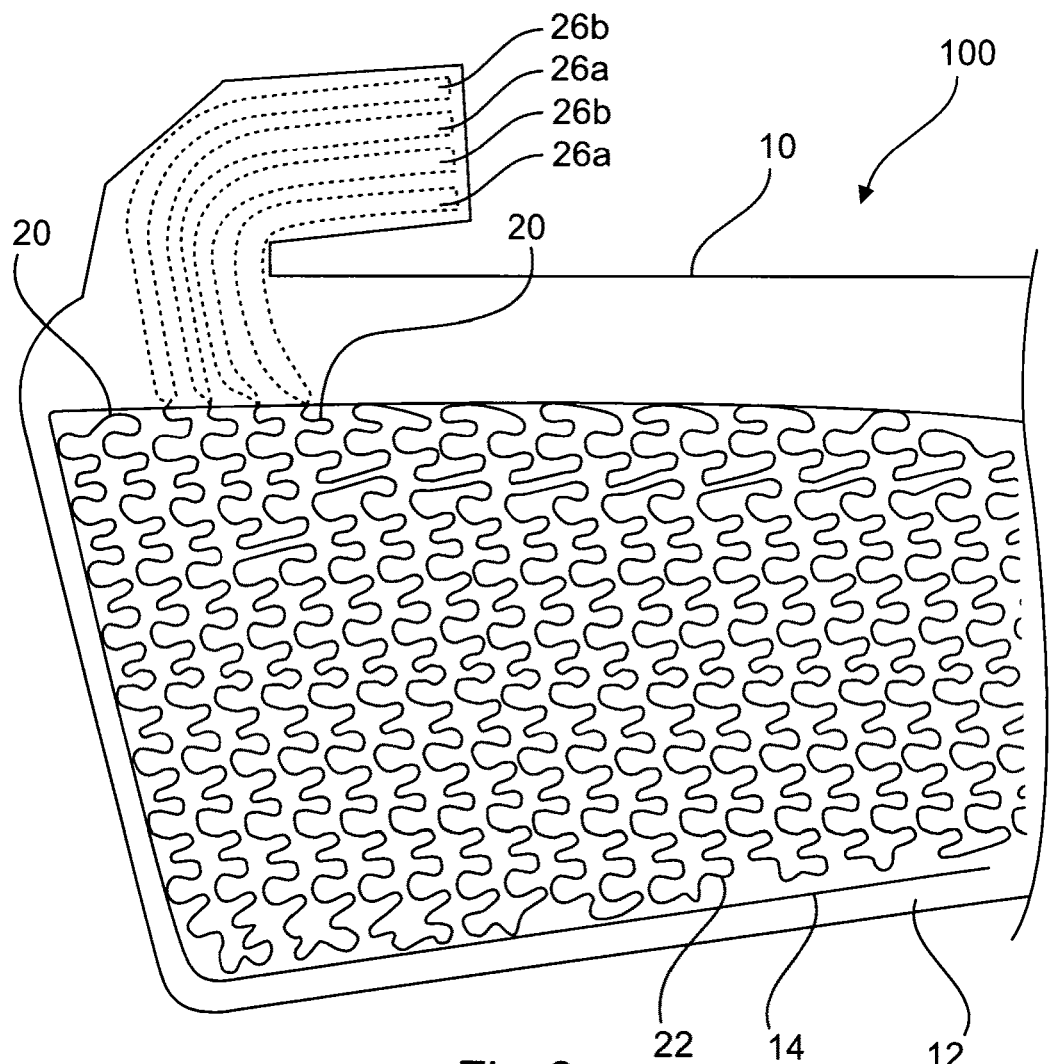
FIG. 9 shows one exemplary embodiment of the electrical heating device according to the invention in a schematic illustration.

FIG. 9 shows an electrical heating device 100 having an electrically conductive film 10. The electrically conductive film 10 has an electrically nonconductive substrate layer 12 and an electrically conductive metal layer 14.

The metal layer 14 includes a structure that is produced by material removal, and on a first side is joined to the substrate layer 12. The structure of the metal layer 14 has two strip conductors 20 that are designed as heating conductors, and that extend continuously in a meandering manner and thus include a plurality of bent heating conductor sections 22. The two heating conductors that extend in a meandering manner each have a nonuniformly bent design in sections, wherein the proportion of bent heating conductor sections is greater than 90%. Contacting sections 26a, 26b are situated on the respective ends of the heating conductors, wherein the heating conductors of the heating device 100 are suppliable with electrical energy via the contacting sections 26a, 26b.

The invention preferably relates to a heating element having an elastically and/or plastically deformable substrate, a strip conductor that is situated on the substrate, and a cover layer whose base area is congruent with the base area of the strip conductor, and whose tensile strength is at least twice that of the strip conductor.

The invention further preferably relates to a connection conductor having at least one machined electrically nonconductive nonconductor zone, and at least one strip conductor that has a bent course, at least in sections, within the conductor level.

LIST OF REFERENCE NUMERALS 10 electrically conductive film
12 substrate layer
14 metal layer
16 cover layer
18 supporting layer
20 strip conductor
22 bent sections
24a-24e meandering sections
26a-26d contacting sections
28a-28e strip conductor sections
30a-30d transition sections
100 electrical heating device
200 cell contacting unit
202a-202d unit cells
204a-204d contact poles
300-312 method steps
B1-B5 strip conductor widths

The invention claimed is:

1. An electrical heating device comprising:
one or more electrically conductive films comprising:
an electrically nonconductive substrate layer; and
an electrically conductive metal layer that has a structure produced by material removal and that on a first side is joined, at least in sections, to the electrically nonconductive substrate layer;
wherein the electrically conductive metal layer is made of copper, a copper alloy, aluminum, and/or an aluminum alloy;
wherein the electrically nonconductive substrate layer is made of a polyethylene naphthalate or polyethylene terephtalate; and
wherein the structure of the electrically conductive metal layer includes one or more strip conductors, and at least on strip conductor includes multiple strip conductor sections whose strip conductor widths differ from one another.

2. The electrical heating device according to claim 1, wherein the one or more electrically conductive films comprises an electrically nonconductive cover layer having a structure that is produced by material removal.

3. The electrical heating device according to claim 2, wherein the structure of the electrically nonconductive cover layer that is produced by material removal is the same, in its entirety or in sections, as the structure of the electrically nonconductive metal layer that is produced by material removal.

4. The electrical heating device according to claim 2, wherein a material of which the electrically nonconductive substrate layer is made has a lower modulus of elasticity than a material of which the electrically nonconductive cover layer is made.

5. The electrical heating device according to claim 2, wherein a difference between a modulus of elasticity of a material of which the electrically nonconductive substrate layer is made and a modulus of elasticity of a material of which the electrically nonconductive cover layer is made is at least 20 megapascals.

6. The electrical heating device according to claim 2, wherein the electrically nonconductive cover layer is made of a polyethylene naphthalate or a polyethylene terephthalate.

7. The electrical heating device according to claim 2, wherein the material of which the electrically nonconductive substrate layer and/or the electrically nonconductive cover layer are made has a modulus of elasticity in the range of 120 to 1200 megapascals.

8. The electrical heating device according to claim 2, wherein the electrically nonconductive metal layer is located on a second side and is joined, at least in sections, to the electrically nonconductive cover layer.

9. The electrical heating device according to claim 1, wherein a material of which the electrically nonconductive substrate layer is made has a modulus of elasticity in the range of 10 to 100 megapascals.

10. The electrical heating device according to claim 1, wherein the electrically nonconductive substrate layer is made of a thermoplastic elastomer.

11. The electrical heating device according to claim 10, wherein the thermoplastic elastomer includes a thermoplastic polyurethane.

12. The electrical heating device according to claim 1, wherein the electrically nonconductive structure of the metal layer includes the one or more strip conductors that have at least one bent section.

13. The electrical heating device according to claim 12, wherein at least one of the one or more strip conductors of the electrically nonconductive metal layer is designed as a heating conductor.

14. The electrical heating device according to claim 12, wherein the at least one of the one or more strip conductors of the electrically nonconductive metal layer extends in a meandering manner in sections.

15. The electrical heating device according to claim 1, wherein the multiple strip conductor sections of the at least one of the one or more strip conductors extend in an offset manner and/or in parallel to one another.

16. The electrical heating device according to claim 1, wherein the strip conductor width of the multiple strip conductor sections, which are successive, of the at least one of the one or more strip conductors increases or decreases along the course of the multiple strip conductor sections.

17. The electrical heating device according to claim 1, wherein the one or more electrically conductive films further comprise an electrically nonconductive supporting layer that is joined to the electrically nonconductive metal layer or to a side of the electrically nonconductive substrate layer opposite from the electrically nonconductive metal layer.

18. The electrical heating device according to claim 17, wherein the electrically nonconductive supporting layer is made of a thermoplastic elastomer.

19. The electrical heating device according to claim 17, wherein adhesion of the electrically nonconductive supporting layer to the electrically nonconductive substrate layer or to the electrically nonconductive metal layer allows damage-free detachment of the electrically nonconductive supporting layer from the substrate layer or the electrically nonconductive metal layer.

* * * * *

UNITED STATES PATENT AND TRADEMARK OFFICE
CERTIFICATE OF CORRECTION

PATENT NO. : 11,388,814 B2
APPLICATION NO. : 16/483627
DATED : July 12, 2022
INVENTOR(S) : Martin Schaetzle It is certified that error appears in the above-identified patent and that said Letters Patent is hereby corrected as shown below:

In the Claims

Column 11, Lines 6-7, delete "the electrically nonconductive" and insert --the electrically conductive--
Column 11, Line 31, delete "the electrically nonconductive" and insert --the electrically conductive--
Column 12, Lines 5-6, delete "the electrically nonconductive structure of the metal layer" and insert --the structure of the electrically conductive metal layer--
Column 12, Line 13, delete "the electrically nonconductive" and insert --the electrically conductive--
Column 12, Line 27, delete "the electrically nonconductive" and insert --the electrically conductive--
Column 12, Line 29, delete "the electrically nonconductive" and insert --the electrically conductive--
Column 12, Line 36, delete "the electrically nonconductive" and insert --the electrically conductive--
Column 12, Lines 38-39, delete "the electrically nonconductive" and insert --the electrically conductive--

Signed and Sealed this
Twenty-fifth Day of October, 2022

Katherine Kelly Vidal
*Director of the United States Patent and Trademark Office*